(12) United States Patent
Nakajima et al.

(10) Patent No.: US 9,187,842 B2
(45) Date of Patent: Nov. 17, 2015

(54) ORIENTED PEROVSKITE OXIDE THIN FILM

(75) Inventors: Tomohiko Nakajima, Ibaraki (JP); Tetsuo Tsuchiya, Ibaraki (JP); Takaaki Manabe, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 183 days.

(21) Appl. No.: 13/640,760

(22) PCT Filed: Apr. 12, 2011

(86) PCT No.: PCT/JP2011/059106
§ 371 (c)(1),
(2), (4) Date: Nov. 30, 2012

(87) PCT Pub. No.: WO2011/129341
PCT Pub. Date: Oct. 20, 2011

(65) Prior Publication Data
US 2013/0065065 A1    Mar. 14, 2013

(30) Foreign Application Priority Data

Apr. 13, 2010  (JP) ................................. 2010-092312
Dec. 9, 2010   (JP) ................................. 2010-274161

(51) Int. Cl.
*C30B 29/24* (2006.01)
*C30B 1/02* (2006.01)
(Continued)

(52) U.S. Cl.
CPC ............... *C30B 1/023* (2013.01); *C03C 17/001* (2013.01); *C03C 17/23* (2013.01); *C04B 35/465* (2013.01);
(Continued)

(58) Field of Classification Search
USPC ...................... 117/4, 5, 7, 8, 9, 940
See application file for complete search history.

(56) References Cited

U.S. PATENT DOCUMENTS 6,576,302 B1   6/2003  Mizuta et al.
7,771,531 B2   8/2010  Tsuchiya et al.
(Continued)

FOREIGN PATENT DOCUMENTS

JP   63-236793 A   10/1988
JP   11-092961 A   4/1999
(Continued)

OTHER PUBLICATIONS

Nakajima et. al. Crystal Growth & Design, vol. 10, 2010, 4861-4867.*
(Continued)

*Primary Examiner* — Robert M Kunemund
(74) *Attorney, Agent, or Firm* — Howson & Howson LLP

(57) ABSTRACT

A thin film which comprises an organic metal salt or an alkoxide salt or an amorphous thin film is formed on a substrate, wherein each of the thin films enables the formation of a Dion-Jacobson perovskite-type metal oxide represented by the composition formula $A(B_{n-1}M_nO_{3n+1})$ (wherein n is a natural number of 2 or greater; A represents one or more monovalent cations selected from Na, K, Rb and Cs; B comprises one or more components selected from a trivalent rare earth ion, Bi, a divalent alkaline earth metal ion and a monovalent alkali metal ion; and M comprises one or more of Nb and Ta; wherein a solid solution may be formed with Ti and Zr) on a non-oriented substrate. The resulting product is maintained at the temperature between room temperature and 600° C.; and crystallization is achieved while irradiating the amorphous thin film or the thin film comprising the organic metal salt or the alkoxide salt on the substrate with ultraviolet light such as ultraviolet laser. In this manner, it becomes possible to produce an oriented Dion-Jacobson perovskite-type oxide thin film characterized in that thin film can be oriented on the substrate in a (001) direction.

16 Claims, 2 Drawing Sheets

(51) Int. Cl.
*C03C 17/00* (2006.01)
*C03C 17/23* (2006.01)
*C04B 35/465* (2006.01)
*C04B 35/468* (2006.01)
*C04B 35/495* (2006.01)
*C30B 7/06* (2006.01)
*C30B 29/30* (2006.01)
*H01L 41/187* (2006.01)
*C30B 1/04* (2006.01)
*C30B 1/10* (2006.01)

(52) U.S. Cl.
CPC ........... *C04B 35/4682* (2013.01); *C04B 35/495* (2013.01); *C30B 1/04* (2013.01); *C30B 1/10* (2013.01); *C30B 7/06* (2013.01); *C30B 29/30* (2013.01); *H01L 41/1871* (2013.01); *H01L 41/1873* (2013.01); *C03C 2217/23* (2013.01); *C04B 2235/3201* (2013.01); *C04B 2235/3205* (2013.01); *C04B 2235/3208* (2013.01); *C04B 2235/3213* (2013.01); *C04B 2235/3224* (2013.01); *C04B 2235/3227* (2013.01); *C04B 2235/3232* (2013.01); *C04B 2235/3244* (2013.01); *C04B 2235/3251* (2013.01); *C04B 2235/3258* (2013.01); *C04B 2235/3291* (2013.01); *C04B 2235/3298* (2013.01); *C04B 2235/441* (2013.01); *C04B 2235/665* (2013.01); *C04B 2235/768* (2013.01); *C04B 2235/787* (2013.01)

(56) References Cited

U.S. PATENT DOCUMENTS

| | | |
|---|---|---|
| 2004/0168636 A1 | 9/2004 | Savvides et al. |
| 2005/0211135 A1 | 9/2005 | Liu et al. |
| 2008/0044590 A1* | 2/2008 | Tsuchiya et al. ............. 427/553 |
| 2008/0044673 A1 | 2/2008 | Miyamoto et al. |
| 2008/0241581 A1* | 10/2008 | Zurbuchen .................... 428/640 |
| 2010/0056678 A1* | 3/2010 | Zur Loye et al. ............. 524/124 |

FOREIGN PATENT DOCUMENTS

| | | |
|---|---|---|
| JP | 2000-256862 A | 9/2000 |
| JP | 2009-070926 A | 4/2009 |
| JP | 2009-070956 A | 4/2009 |
| JP | 2010-056454 A | 3/2010 |
| WO | 99/41212 A1 | 8/1999 |

OTHER PUBLICATIONS

A.T. Hermann et al., "Thermal stability of Dio-Jacobson mixed-metal-niobate double-layered perovskites", Materials Research Bulletin, vol. 44, pp. 1046-1050, May 6, 2009.

T. Mitsuyama et al., "Relationship between interlayer hydration and photocatalytic water splitting of A'1-xNaxCa2Ta3O10 nH2O (A'=K and Li)" Journal of Solid State Chemistry, vol. 181, pp. 1419-1442, 2008.

* cited by examiner

ORIENTED PEROVSKITE OXIDE THIN FILM

BACKGROUND ART

The present invention relates to a technology to form a (001) oriented oxide thin film on a non-oriented substrate. More specifically, the present invention relates to a method of manufacturing a (001) oriented Dion-Jacobson perovskite-type oxide thin film and various perovskite-type oxide thin films oriented in a (001) direction thereon and expected to show high performance, and to a variety of perovskite-type (001) oriented multilayer films highly oriented and expected to show high performance, which are prepared by the manufacturing method.

In recent years, due to densely integrated electronic devices as well as the development of the Internet driven information society, advances in electronic materials used in the materials for a display and electronics has been an urgent issue.

Presently, there are an extremely large number of materials having a crystal lattice called a perovskite type, among the oxides used for electronic materials. Perovskite-type oxide $ABO_3$ has a crystal structure in which the A ions (A is mainly an alkali metal, an alkaline earth metal, a rare earth element) occupy the space in the lattice formed by corner-sharing of the B ions octahedrally coordinated by oxygen (B is mainly a transition metal element) as shown in FIG. 1. Depending on the valence number and the size of the A ion, the number of the d electrons of the B ion is controlled and the distorted crystal structure may change. These various control parameters are responsible for manifestation of physical properties such as conductivity, dielectricity, emission characteristics and magnetism, which are useful for applications. Therefore, perovskite-type oxides have been extensively studied until now.

In actual applications, these oxide materials are often used in the form of a thin film. Usually, the higher the crystallinity, the better the various physical properties become. This also applies to perovskite-type oxides. An epitaxial thin film manufactured using a single crystal substrate may often show the best properties (Patent Literature 1). However, when applied as oxide materials, a single crystal substrate is rarely used, but non-oriented polycrystalline ceramics, a glass and a polycrystalline metal substrate are usually used. Therefore, in order to improve the properties of oxide thin film materials, the improvement of crystallinity, especially technologies for orientating crystal grains have been developed (Patent Literatures 2 and 3). However, because many of conventional orientation technologies mainly uses vapor phase methods such as sputtering and the ion beam assisted method, film-forming environments have limitations such as precise control of film-forming atmosphere, and there have been problems in handling of large-area thin film materials, product throughput and the like. To date, as a method of producing a certain type of metal oxide films, a method of manufacturing a metal oxide and a metal oxide thin film by excimer laser (Excimer Laser Assisted Metal Organic Deposition), which is highly on-demand film-forming technique, is known (Patent Literature 4). The method comprises the steps of: dissolving a metal organic acid salt or an organometallic compound $M_mR_n$ (provided that M=a group 4b element of Si, Ge, Sn, Pb, a group 6a element of Cr, Mo, W, a group 7a element of Mn, Tc, Re; R=an alkyl group such as $CH_3$, $C_2H_5$, $C_3H_7$, $C_4H_9$, or a carboxyl group such as $CH_3COO^-$, $C_2H_5COO^-$, $C_3H_7COO^-$, $C_4H_9COO^-$, or a carbonyl group such as CO; wherein m, n are integers) in a soluble solvent; alternatively if a liquid, using it as is; dispersively applying the solution on the substrate; and then irradiating the substrate with the excimer laser in air.

The document describes a method of manufacturing a metal oxide product, comprising the steps of: forming a metal oxide on a substrate by dissolving a metal organic compound in a solvent to form a solution; applying the solution to the substrate; then drying the substrate; and irradiating the substrate with a laser beam of a wavelength of 400 nm or less, for example, excimer laser selected from ArF, KrF, XeCl, XeF, $F_2$. The document also describes that the irradiation with a laser beam having a wavelength of 400 nm or less is performed in multiple steps where at the first step of the irradiation, the beam is weak enough not to result in complete decomposition of the metal organic compound and the subsequent irradiation is strong enough to allow the compound to be converted into an oxide. Further, it is also known that the metal organic compound is a compound of two or more components comprising different metals; and the resulting metal oxide is a composite metal oxide comprising different metals; and the metal in the metal organic salt is selected from the group consisting of iron, indium, tin, zirconium, cobalt, iron, nickel and lead.

For a perovskite-type oxide, known is a method of manufacturing a composite oxide thin film, comprising the steps of: applying a precursor coating solution containing raw materials of respective oxides of La, Mn and Ca, Sr or Ba on a surface of a coating target to obtain a film; then crystallizing the thin film formed on the coating target to form a composite oxide film (which does not show superconductivity) represented by the composition formula $(La_{1-x}M_x)MnO_{3-\delta}$ (M: Ca, Sr, Ba, $0.09 \leq x \leq 0.50$), wherein after applying the precursor coating solution on the surface of the coating target to obtain the film, the thin film formed on the surface of the coating target is irradiated with light having a wavelength of 360 nm or less to crystallize the thin film (Patent Literature 5). The document describes that as a light source for irradiating the thin film formed on the surface of the coating target, ArF excimer laser, KrF excimer laser, XeCl excimer laser, XeF excimer laser, third harmonic generation of YAG laser, or fourth harmonic generation of YAG laser is used, and the precursor coating solution to be applied on the surface of the coating target is adjusted by mixing an alkanolamine coordination compound of La, a carboxylate of Mn, and a metal or alkoxide of M in a primary alcohol having 1 to 4 carbon atoms to allow a reaction. For a perovskite-type oxide thin film which is a phosphor, in addition to a simple perovskite structure of the $ABO_3$ type, the document also describes a method of manufacturing a thin film of a perovskite-related structure called the Dion-Jacobson phase represented by the composition formula $A(B_{n-1}M_nO_{3n+1})$ (wherein n is a natural number of 2 or greater; A is an alkali metal ion; B comprises a trivalent rare earth ion, Bi, a bivalent alkaline earth metal ion or a monovalent alkali metal ion; and M comprises Nb and Ta; wherein Ti may be solid soluted), or the Ruddlesden-Popper phase represented by the composition formula $A_2(B_{n-1}M_nO_{3n+1})$ (Patent Literature 6).

Patent Literature 1: Japanese Patent Laid-Open No. 2009-70926
Patent Literature 2: Japanese Patent Laid-Open No. 2004-530046
Patent Literature 3: Japanese Patent Laid-Open No. S63-236793
Patent Literature 4: Japanese Patent Laid-Open No. 2001-31417
Patent Literature 5: Japanese Patent Laid-Open No. 2000-256862

Patent Literature 6: Japanese Patent Laid-Open No. 2008-75073

SUMMARY OF THE INVENTION

Problem to be Solved by the Invention

However, there has been no established technology to control thin film orientation for the Excimer Laser Assisted Metal Organic Deposition using excimer laser. Further, there has been no established manufacturing technique which can manufacture a perovskite-type oxide thin film expected to show high performance particularly on a non-oriented substrate and a layered thin film material thereof by a simple procedure at a process temperature of 700 degrees or below.

In view of this, the present invention provides a novel manufacturing method capable of producing a perovskite-type oxide thin film which is highly orientated on a substrate and expected to show high performance using Excimer Laser Assisted Metal Organic Deposition and the like even if the substrate is a non-oriented substrate such as a glass and a polycrystal substrate, and the present invention also provides an oriented layered thin film material thereof.

The present invention also provides a novel manufacturing method of producing a perovskite-type oxide thin film expected to show high performance on a substrate and an oriented layered thin film material thereof at a process temperature of 700 degrees or below using Excimer Laser Assisted Metal Organic Deposition and the like even if the substrate is a non-oriented substrate such as a glass and a polycrystal substrate.

Means to Solve the Problems

The present invention allows a perovskite-type oxide thin film to be oriented using Excimer Laser Assisted Metal Organic Deposition and the like. In particular, the present invention provides an orientation technology to allow a perovskite-type oxide to be oriented in a (001) direction. The (001) direction in the perovskite-type oxide represents a plane direction of Cube surface when the direction along the c-axis, i.e., a perovskite-type structure is considered to be Cube in the crystal structure shown in FIG. 1. In a cubic crystal, the (100), (010) and (001) directions are equivalent. Furthermore, even in the case of a tetragonal, an orthorhombic, a triclinic, a rhombohedral crystal, the (100) and (010) directions can be considered as equivalent to the (001) direction described above if each axis has an angle close to right angle, provided that a lattice constant corresponding to one side of Cube is within the common range of about 3.60 to 4.20 Å in a simple perovskite structure. (A direction of actual orientation is to be selected from (001), (100) and (010), depending on the properties of crystal growth for a material.)

After extensive studies, the present inventors have found that when forming a thin film of a Dion-Jacobson perovskite substance using a certain film-forming method, a highly oriented thin film in a (001) direction can be obtained even on a non-oriented substrate such as a glass and a polycrystalline substrate, and that the thin film is highly effective as a seed crystal layer for obtaining a variety of highly oriented films of perovskite substances. The present invention is based on these findings.

Firstly, the present invention provides a method of producing a seed crystal layer on which a (001) orientation can be stably formed in order to provide a (001) oriented film of a perovskite-type oxide. A film of the Dion-Jacobson perovskite substance described above is to be formed on a non-oriented substrate. The present invention provides a method of forming an oriented Dion-Jacobson perovskite-type oxide thin film, the method comprising the steps of: forming an amorphous thin film or a thin film comprising an organic metal salt or an alkoxide salt on a substrate, wherein the amorphous thin film or the thin film can form a Dion-Jacobson perovskite-type oxide thin film represented by the composition formula $A(B_{n-1}M_nO_{3n+1})$ (wherein n is a natural number of 2 or greater; A represents one or more monovalent cations selected from Na, K, Rb and Cs; B comprises one or more components selected from a trivalent rare earth ion, Bi, a divalent alkaline earth metal ion and a monovalent alkali metal ion; M comprises one or more of Nb and Ta; and Ti, Zr may be solid soluted); maintaining temperature between room temperature and 600° C.; allowing a crystal to grow while irradiating the amorphous thin film or the thin film comprising the organic metal salt or the alkoxide salt on the substrate with ultraviolet light such as ultraviolet laser, thereby obtaining an oriented structure in a (001) direction on the substrate. For convenience, the (001) plane of the Dion-Jacobson phase is defined as a layered direction in which A site cations are regularly aligned in layers as shown in FIG. 2. With regard to a composition, crystal growth will not be affected even if ion impurities are introduced in an amount of about several percents in addition to the above composition.

Further, according to the present invention, a thin film of a metal oxide or an organic metal salt can be produced by any of MBE, vacuum deposition, CVD, or coating-pyrolysis. Moreover, according to the present invention, an organic compound in the organic metal salt can be selected from β-diketonato, long chain alkoxide having 6 or more carbon atoms and organic acid salts which may contain halogen. Furthermore, according to the present invention, a pulsed laser at 400 nm or less can be used as ultraviolet light. Furthermore, according to the present invention, a thin film of a metal oxide or an organic metal salt can be irradiated with ultraviolet laser at temperature between room temperature and 600° C. after the thin film is irradiated with an ultraviolet lamp. Moreover, according to the present invention, a thin film of a metal oxide or an organic metal salt can be irradiated with ultraviolet laser at temperature between room temperature and 600° C. after the thin film is heated to temperature between 300 and 600° C. Furthermore, according to the present invention, a thin film of a metal oxide or an organic metal salt can be irradiated at different fluences with a laser beam having a fluence of 40 to 100 mJ/cm² or more after the thin film is irradiated with an ultraviolet laser at room temperature under the conditions where a combination of frequency and fluence are used such that ablation will not occur. A perovskite oxide-type oxide multilayered film in which a perovskite oxide having a lattice constant of 3.60 to 4.20 Å in a simple perovskite lattice is (001) oriented on the Dion-Jacobson oriented seed crystal layer manufactured by the above approach similarly using Excimer Laser Assisted Metal Organic Deposition.

The features of the present invention as described above are summarized as follows:

(1) A method of forming an oriented Dion-Jacobson perovskite-type oxide thin film, the method comprising the steps of: forming a thin film comprising an organic metal salt or an alkoxide salt or a amorphous thin film on a substrate, wherein the thin film or the amorphous thin film can form a perovskite-type oxide thin film called a Dion-Jacobson phase represented by the composition formula $A(B_{n-1}M_nO_{3n+1})$ (wherein n is a natural number of 2 or greater; A represents one or more monovalent cations selected from Na, K, Rb and Cs; B comprises one or more components selected from a trivalent rare earth ion, Bi, a divalent alkaline earth metal ion and a monovalent alkali metal ion; M comprises one or more of Nb and Ta; and Ti, Zr may be solid soluted); maintaining temperature between room temperature and 600° C.; allowing a crystal to grow while irradiating the amorphous thin film or the thin film comprising the organic metal salt or the alkoxide salt on the substrate with ultraviolet light, thereby obtaining an oriented structure in a (001) direction which is a layered direction where A site cations are regularly aligned in layers on the substrate.

(2) The method of forming an oriented Dion-Jacobson perovskite-type oxide thin film of (1), wherein the monovalent cation of A in the composition formula is one which can be partly or entirely replaced with $Li^+$, $Na^+$, $K^+$, $Rb^+$, $Cs^+$, $H^+$, $H_3O^+$, $Cu^+$, $Ag^+$, $Tl^+$, $(CuX)^+$, $(VX)^+$, $(CrX)^+$, $(MnX)^+$, $(FeX)^+$, $(CoX)^+$, $(NiX)^+$ (wherein X represents one or more monovalent anions selected from Cl, Br and I) by ion exchange using common solution techniques or solid phase techniques after manufacturing the orientated film.

(3) The method of manufacturing a (001) oriented Dion-Jacobson perovskite-type oxide thin film of (1) or (2), wherein the amorphous thin film is produced by any of MBE, vacuum deposition, CVD, coating pyrolysis, and wherein an organic compound in the film of the organic metal salt or the alkoxide salt is one species selected from β-diketonato, long chain alkoxide having 6 or more carbon atoms, and organic acid salts which may include halogen.

(4) The method of manufacturing a (001) oriented Dion-Jacobson perovskite-type oxide thin film of any one of (1) to (3), wherein the ultraviolet light is a pulsed laser of 400 nm or less, and a thin film with a thickness of 300 nm or less after the film-forming crystallization is irradiated with a laser beam having a fluence in the range between 40 and 100 mJ/cm² per laser irradiation.

(5) The method of manufacturing a (001) oriented Dion-Jacobson perovskite-type oxide thin film of any one of (1) to (4), wherein after performing at least one of the steps of: irradiating the amorphous thin film or the thin film comprising the organic metal salt or the alkoxide salt with an ultraviolet lamp; and heating the amorphous thin film or the thin film at temperature between 300° C. and 600° C., the amorphous thin film or the thin film is irradiated with ultraviolet laser at temperature between room temperature and 600° C.

(6) The method of manufacturing a (001) oriented Dion-Jacobson perovskite-type oxide thin film of any one of (1) to (4), wherein after irradiating the amorphous thin film or the thin film comprising the organic metal salt or the alkoxide salt with ultraviolet laser at room temperature under the conditions where a combination of frequency and fluence are used such that ablation will not occur, the amorphous thin film or the thin film is irradiated at different fluences with a laser beam having a fluence in the range between 40 and 100 mJ/cm².

(7) A (001) oriented Dion-Jacobson perovskite-type oxide thin film, which is produced on a amorphous glass substrate using the method of any one of (1), (5) and (6).

(8) A (001) oriented Dion-Jacobson perovskite-type oxide thin film, which is produced on a substrate comprising glass, polycrystal or single-crystal using the method of any one of (1), (5) and (6).

(9) A (001) oriented perovskite-type oxide multilayered film, wherein a perovskite oxide having a lattice constant of 3.60 to 4.20 Å in a simple perovskite lattice is (001) oriented on an oriented seed crystal, the oriented seed crystal being the (001) oriented Dion-Jacobson perovskite-type oxide thin film of (7) or (8).

(10) A method of manufacturing a $LaNiO_3$ thin film, the method comprising the steps of: forming, on a glass substrate, an amorphous thin film or a thin film comprising an organic metal salt or an alkoxide salt, the amorphous thin film or the thin film being capable of forming $LaNiO_3$; maintaining temperature between room temperature and 600° C.; allowing a crystal to grow while irradiating the amorphous thin film or the thin film comprising the organic metal salt or the alkoxide salt on the substrate with ultraviolet laser having a fluence of 90 mJ/cm² or less.

(11) A method of manufacturing a (001) oriented $LaNiO_3$ thin film, the method comprising the steps of: forming an amorphous thin film or a thin film comprising an organic metal salt or an alkoxide salt on the (001) oriented Dion-Jacobson perovskite-type oxide thin film of (7) or (8), the amorphous thin film or the thin film being capable of forming $LaNiO_3$; maintaining temperature between room temperature and 600° C.; allowing a crystal to grow while irradiating the amorphous thin film or the thin film comprising the organic metal salt or the alkoxide salt on the substrate with ultraviolet laser having a fluence of 60 mJ/cm² or less; thereby allowing growth in a (001) orientation.

(12) A $LaNiO_3$ thin film usable as a lower electrode, which is produced at a process temperature of 600° C. or below of (10) or (11).

(13) A method of manufacturing a $Li_xNa_yK_zNb_aTa_bO_3$ thin film, the method comprising the steps of: forming, on a substrate, an amorphous thin film or a thin film comprising an organic metal salt or an alkoxide salt, the amorphous thin film or the thin film being capable of forming $Li_xNa_yK_zNb_aTa_bO_3$ (wherein x+y+z=0.8 to 1.5; a+b=0.9 to 1.1; at least one of Cu, Zn, Al, B may be doped; oxygen deficiency may exist); maintaining temperature between room temperature and 600° C.; allowing a crystal to grow while irradiating the amorphous thin film or the thin film comprising the organic metal salt or the alkoxide salt on the substrate with ultraviolet laser having a fluence in the range between 30 and 60 mJ/cm².

(14) A method of manufacturing a (001) oriented $Li_xNa_yK_zNb_aTa_bO_3$ thin film, the method comprising the steps of: forming an amorphous thin film or a thin film comprising an organic metal salt or an alkoxide salt on the (001) oriented Dion-Jacobson perovskite-type oxide thin film of (7) or (8), the amorphous thin film or the thin film being capable of forming $Li_xNa_yK_zNb_aTa_bO_3$ of (13); maintaining temperature between room temperature and 600° C.; allowing a crystal to grow while irradiating the amorphous thin film or the thin film comprising the organic metal salt or the alkoxide salt on the substrate with ultraviolet laser having a fluence in the range between 30 and 60 mJ/cm², thereby allowing growth in a (001) orientation.

(15) A material for a piezoelectric body, wherein the lead-free dielectric $Li_xNa_yK_zNb_aTa_bO_3$ of (13) or (14) is produced on a metal plate such as Pt or on the $LaNiO_3$ thin film of (12) at a process temperature of 600° C. or below.

(16) A dielectric (001) oriented $Ba_xSr_yCa_zTi_aZr_bO_3$ thin film, wherein an amorphous thin film or a thin film comprising an organic metal salt or an alkoxide salt is formed on the (001) oriented Dion-Jacobson perovskite-type oxide thin film of (7) or (8), the amorphous thin film or the thin film being capable of forming $Ba_xSr_yCa_zTi_aZr_bO_3$ (wherein x+y+z=0.9 to 1.1; a+b=0.9 to 1.1; and oxygen deficiency may exist); temperature is maintained between room temperature and 600° C.; a crystal is allowed to grow while irradiating the amorphous thin film or the thin film comprising the organic metal salt or the alkoxide salt on the substrate with ultraviolet laser having a fluence in the range between 50 and 100 mJ/cm², thereby allowing growth in a (001) orientation.

(17) A material for a piezoelectric body comprising a dielectric (001) oriented $Ba_xSr_yCa_zTi_aZr_bO_3$ thin film, wherein an amorphous thin film or a thin film comprising an organic metal salt or an alkoxide salt is formed on an electrode of the (001) oriented $LaNiO_3$ thin film of (11), the amorphous thin film or the thin film being capable of forming $Ba_xSr_yCa_z$-$Ti_aZr_bO_3$ (wherein x+y+z=0.9 to 1.1; a+b=0.9 to 1.1; and oxygen deficiency may exist); temperature is maintained between room temperature and 600° C.; a crystal is allowed to grow while irradiating the amorphous thin film or the thin film comprising the organic metal salt or the alkoxide salt on the substrate with ultraviolet laser having a fluence in the range between 50 and 100 mJ/cm$^2$, thereby allowing growth in a (001) orientation.

(18) A (001) oriented perovskite-type oxide phosphor thin film which is obtained by; forming a thin film of a metal oxide or an organic metal salt capable of forming the metal oxide on the (001) oriented Dion-Jacobson perovskite-type oxide thin film of (7) or (8), the metal oxide being a metal oxide represented by the composition formulae $ABO_3$, $A_2BO_4$, $A_3B_2O_7$ to which at least one element selected from the group consisting of Ce, Pr, Nd, Sm, Eu, Gd, Tb, Dy, Ho, Er, Tm, Yb, Lu is added, wherein A is an alkaline earth metal element selected from Ca, Sr, Ba, and B is a metal element selected from Ti, Sn; maintaining temperature between room temperature and 600° C.; allowing a crystal to grow while irradiating the formed thin film of the metal oxide or the organic metal salt with ultraviolet laser.

(19) A method of manufacturing an oriented Dion-Jacobson perovskite-type oxide thin film, the method comprising the steps of: forming, on a substrate, an amorphous thin film or a thin film comprising an organic metal salt or an alkoxide salt, the amorphous thin film or the thin film being capable of forming $AB_2M_3O_{10}$ having a Dion-Jacobson phase represented by the composition formula $A(B_{n-1}M_nO_{3n+1})$ of (1) or (2) wherein n=3; maintaining temperature between room temperature and 600° C.; allowing a crystal to grow while irradiating the amorphous thin film or the thin film comprising the organic metal salt or the alkoxide salt on the substrate with ultraviolet laser having a fluence of 100 mJ/cm$^2$ or more, thereby allowing orientation in a (100) direction orthogonal to a layered direction where A site cations are regularly aligned in layers on the substrate.

(20) A (001) oriented anatase-type titanium oxide thin film, wherein an anatase-type titanium oxide ($TiO_2$: a dissimilar metal may be doped in a Ti site, and an oxygen site may be deficient or doped with S and N) is formed on an oriented seed crystal, the oriented seed crystal being the (001) oriented Dion-Jacobson perovskite-type oxide thin film of (7) or (8); thereby enabling a (001) orientation in the case where a lattice plane of the tetragonal square lattice for the anatase-type titanium oxide is taken as an ab plane.

(21) A photocatalytic material comprising the (001) oriented anatase-type titanium oxide thin film of (20).

(22) A (001) oriented perovskite-type $AgNbO_3$ thin film, which is obtained by: forming, on an oriented seed crystal, an amorphous thin film or a thin film comprising an organic metal salt or an alkoxide salt, the oriented seed crystal being the (001) oriented Dion-Jacobson perovskite-type oxide thin film of (7) or (8), and the amorphous thin film or the thin film being capable of forming $AgNbO_3$ (wherein alkaline earth ions and/or an rare earth ions may be solid soluted at Ag sites, and one or more of Ti, Zr, Ta may be solid soluted at Nb sites); maintaining temperature between 700° C. and 950° C. for crystallization.

(23) A photocatalytic material comprising the (001) oriented perovskite-type $AgNbO_3$ thin film of (22).

(24) A (100) oriented $A_xWO_3$ thin film, which is obtained by: forming, on an oriented seed crystal, an amorphous thin film or a thin film comprising an organic metal salt or an alkoxide salt, the oriented seed crystal being the (001) oriented Dion-Jacobson perovskite-type oxide thin film of (7) or (8), and the amorphous thin film or the thin film being capable of forming $A_xWO_3$ (wherein alkali metal ions and/or protons may be solid soluted at A, and x is in the range between 0 and 0.4); maintaining temperature between 400° C. and 900° C. for crystallization.

The present invention makes it possible to obtain various high performance (001) oriented perovskite oxide thin films formed in the (001) orientation on a Dion-Jacobson perovskite thin film, the Dion-Jacobson perovskite thin film being a (001) oriented seed crystal thin film efficiently produced on a non-oriented substrate such as a glass and a polycrystalline substrate at low temperature in a fashion suitable for large-scale production, which was previously not possible.

Moreover, according to the present invention, even in the case where various perovskite-type oxide thin films are directly formed without providing an oriented Dion-Jacobson perovskite-type oxide thin film on a substrate, a perovskite-type oxide thin film expected to show high performance and a layered thin film material thereof can be formed at a process temperature of 700 degrees or below.

DETAILED DESCRIPTION OF THE INVENTION

One preferred mode for carrying out the present invention is a method of manufacturing a (001) oriented perovskite thin film, the method comprising the steps of: applying a solution of an organic compound of a metal on a support; emitting ultraviolet light such as ultraviolet laser at each of a drying step, a pre-calcining step and a main-calcining step, wherein the solution of the organic compound of the metal forms a (001) oriented Dion-Jacobson perovskite seed crystal thin film and a (001) oriented perovskite thin film layered thereon.

Ultraviolet light used in the present invention may include excimer laser, which is a pulsed laser beam. Excimer laser can be selected from ArF, KrF, XeCl, XeF, $F_2$ and the like which have a wavelength of 400 nm or less. Irradiation with ultraviolet light may be performed during a predetermined step, before and/or after each step, depending on the purpose. Further, a film having a large area can also be produced by spin coating a solution of an organic compound of a metal on a substrate; drying and pre-calcining the substrate in a thermostated bath at 130° C. to remove solvent; and then scanning the substrate with ultraviolet laser irradiation.

According to the present invention, in order to allow a perovskite-type oxide on a substrate to be (001) oriented, firstly, a (001) oriented Dion-Jacobson perovskite seed crystal thin film is produced on the substrate.

Figure 1:
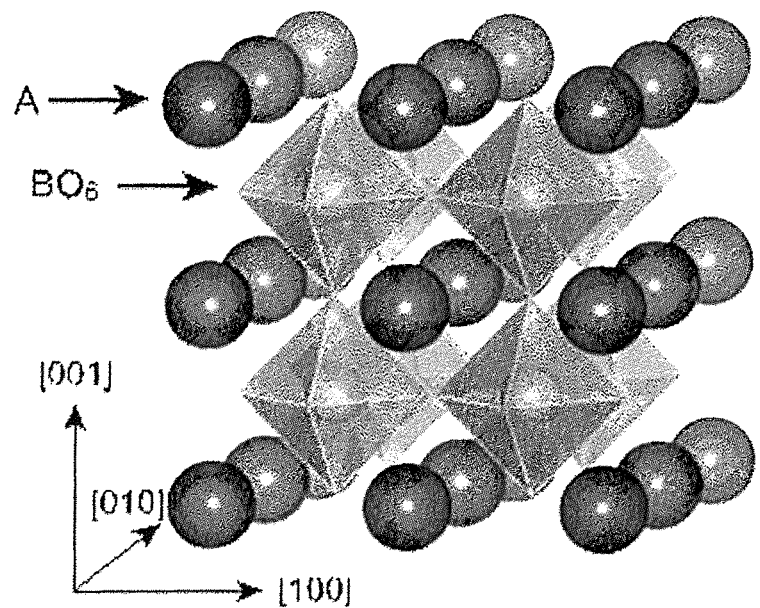
FIG. 1 shows a model of the crystal structure of a perovskite type oxide ($ABO_3$).
Figure 2:
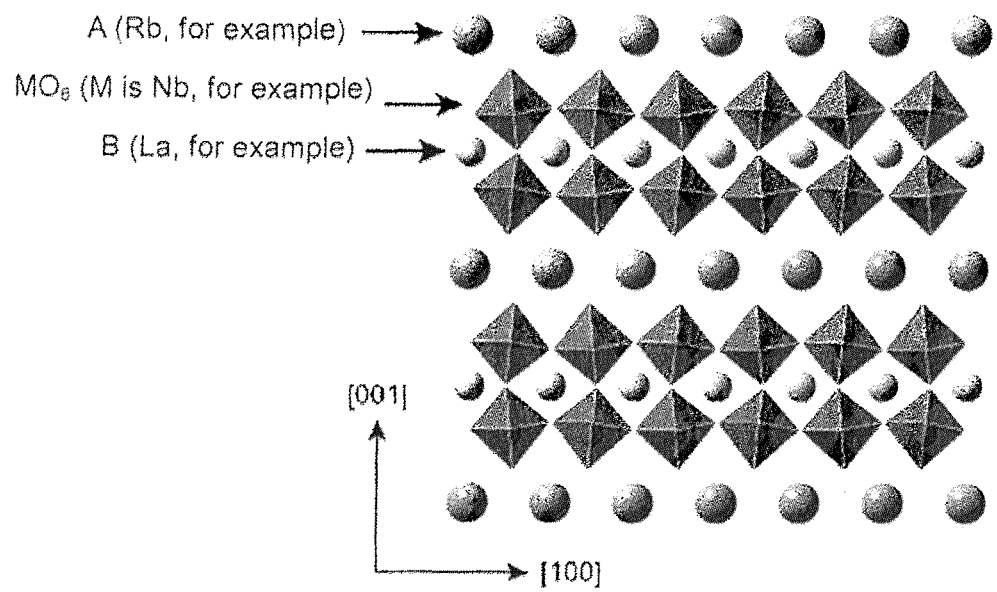
FIG. 2 shows a model of the crystal structure of a Dion-Jacobson perovskite-type oxide ($ABM_2O_7$).

A Dion-Jacobson perovskite-type oxide is represented by the composition formula $A(B_{n-1}M_nO_{3n+1})$ (wherein n is a natural number of 2 or greater; A represents one or more monovalent cations selected from Na, K, Rb and Cs; B comprises one or more components selected from a trivalent rare earth ion, Bi, a divalent alkaline earth metal ion and a monovalent alkali metal ion; M comprises one or more of Nb and Ta; and Ti and Zr may be solid soluted). Representative examples include $RbLaNb_2O_7$ having a structure shown in FIG. 2.

The trivalent rare earth ions of B in the above composition formula preferably include La, Pr, Y and Sc, and the divalent alkaline earth metal ions preferably include Ca, Sr and Ba, respectively.

In order to form a Dion-Jacobson perovskite-type oxide of the above composition formula on a substrate, an amorphous thin film capable of creating this composition is formed on the substrate. Methods of forming the amorphous thin film include MBE, vacuum deposition, CVD, coating pyrolysis. Coating pyrolysis is preferred because it has few limitations in film-forming atmosphere and easily used for a film having a large area.

The coating pyrolysis method uses a precursor solution coating approach based on a chemical solution method including the spin coating method, the dip method, the spray method and the ink-jet method. In the coating pyrolysis method, an amorphous thin film is formed by coating a solution of a metal organic compound capable of creating the above composition on a substrate by the spin coating method, a coating method such as spraying and the ink-jet method; drying the substrate; and then decomposing an organic component in the metal organic compound. The metal organic compounds preferably include organic metal salts and alkoxide salts, and organic compounds thereof include β-diketonato, long chain alkoxides having 6 or more carbon atoms and organic acid salts which may contain halogen. Such organic acids include 2-ethylhexanoic acid, naphthenic acid, caprylic acid and stearin acid. An organic component in the metal organic compound can be decomposed by, for example, pre-calcination by heating and maintaining at temperature between 300 and 600° C., and irradiation with ultraviolet light using an ultraviolet lamp, and the like.

The amorphous thin film formed on the substrate is crystallized at temperature (of a substrate or atmosphere) between room temperature and 600° C. (preferably 300 to 500° C.) by irradiation with ultraviolet light such as ultraviolet laser to form a (001) oriented Dion-Jacobson perovskite-type oxide thin film. There is no particular limitation in the atmosphere under which irradiation is performed with ultraviolet light. The irradiation can be performed under air atmosphere. Ultraviolet light such as ultraviolet laser used in crystallization can be used to perform both the decomposition of an organic component in the metal organic compound and the subsequent crystallization. The Dion-Jacobson perovskite-type oxide thin film has a thickness of any values as long as an oxide thin film to be formed thereon will be well oriented, but the thickness may generally be 10 to 400 nm, and preferably 20 to 100 nm to obtain a well oriented state.

After forming an oriented Dion-Jacobson perovskite-type oxide thin film on a substrate, various perovskite-type oxide thin films corresponding to a desired application and property are formed on the oriented Dion-Jacobson perovskite-type oxide thin film. Any types of perovskite-type oxides can be used for this purpose, for example, including those to serve as any of a dielectric substance, a piezoelectric body, a phosphor or the like. Specifically, they include $LaNiO_3$, $Li_xNa_yK_zNb_a$-$Ta_bO_3$ (x+y+z=0.8 to 1.5; a+b=0.9 to 1.1; and at least one of Cu, Zn, Al and B may be doped; oxygen deficiency may exist), $Ba_xSr_yCa_zTi_aZr_bO_3$ (x+y+z=0.9 to 1.1; a+b=0.9 to 1.1; and oxygen deficiency may exist) and those having a lattice constant of 3.60 to 4.20 Å in a simple perovskite lattice.

This perovskite-type oxide thin film will be highly oriented by using an oriented Dion-Jacobson perovskite-type oxide thin film as a seed crystal layer even if a non-oriented substrate such as a glass and a polycrystalline substrate is used. According to the present invention, a perovskite-type oxide thin film having the degree of orientation of 0.9 or more, in some cases, 0.95 or more and close to 1 in terms of the Lotgering factor.

This perovskite-type oxide thin film can be formed by the same way as the method of forming an oriented Dion-Jacobson perovskite-type oxide thin film. That is, an amorphous thin film capable of creating the composition of this perovskite-type oxide is formed on an oriented Dion-Jacobson perovskite-type oxide thin film by MBE, vacuum deposition, CVD, coating pyrolysis and the like. In the case of coating pyrolysis, an amorphous thin film is formed by applying a solution of a metal organic compound capable of creating the above composition on a substrate; drying the substrate; and then decomposing an organic component in the metal organic compound by pre-calcination, irradiation with ultraviolet light and the like. An amorphous thin film formed on the orientated Dion-Jacobson perovskite-type oxide thin film is crystallized by irradiation with ultraviolet light such as ultraviolet laser at temperature between room temperature and 600° C. (preferably, 300 to 500° C.) to from a (001) oriented perovskite-type oxide thin film, resulting in the formation of an oriented layered thin film on a substrate.

According to the method of forming a perovskite-type oxide thin film comprising the steps of: forming an amorphous thin film by coating pyrolysis as described above; and allowing a crystal to grow by irradiating the amorphous thin film with ultraviolet light such as ultraviolet laser at temperature between room temperature and 600° C. (preferably 300 to 500° C.), a perovskite-type oxide thin film expected to show high performance and a layered thin film material thereof can be manufactured on a substrate at a process temperature of 700° C. or below. Therefore, even in the case where various perovskite-type oxide thin films are directly formed without an oriented Dion-Jacobson perovskite-type oxide thin film provided on a non-oriented substrate such as a glass and a polycrystalline substrate, a perovskite-type oxide thin film expected to show a good property and a layered thin film material thereof can be formed at a process temperature of 700° C. or blow, preferably 600° C. or blow, more preferably 500° C. or blow, although a high degree of orientation may not be obtained.

(Experimental Examples)

Figure 3:
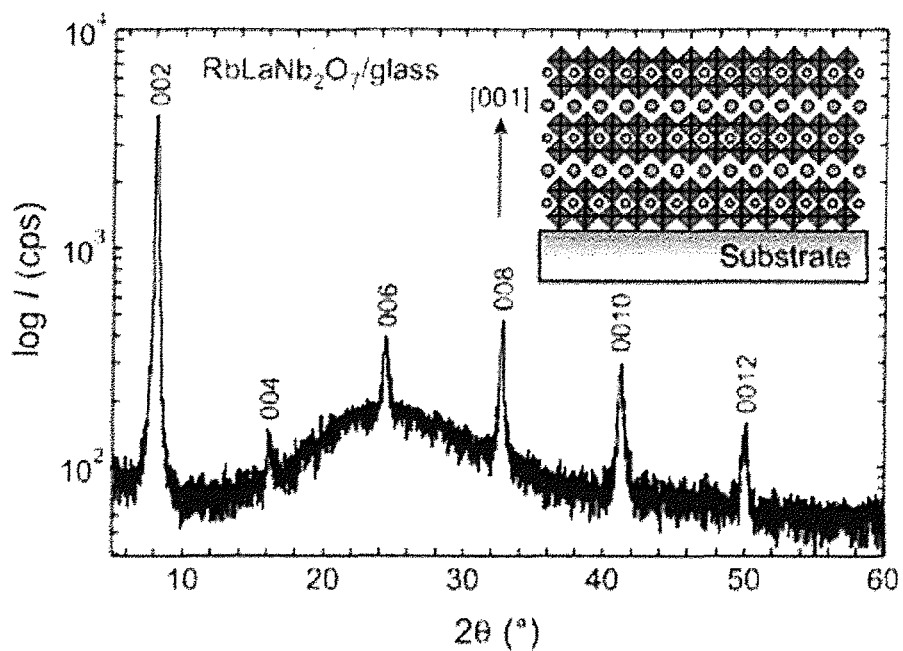
FIG. 3 shows an X-ray diffraction pattern of a (001) oriented $RbLaNb_2O_7$ thin film produced on an alkaline-free glass substrate.
Figure 4:
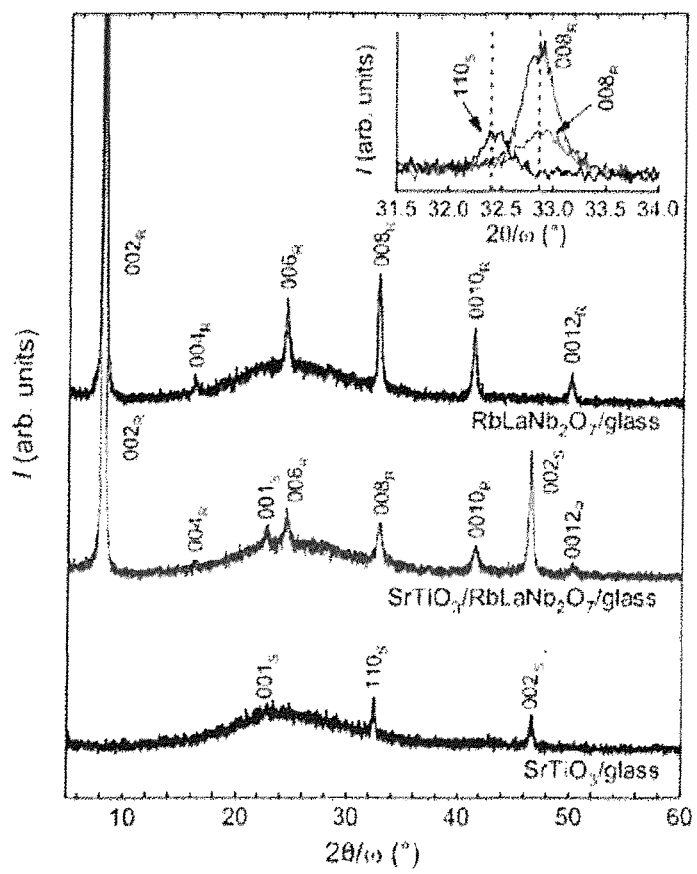
FIG. 4 shows X-ray diffraction patterns of a $SrTiO_3$ thin film produced in layers on a (001) oriented $RbLaNb_2O_7$ thin film on an alkaline-free glass substrate, and a $SrTiO_3$ thin film produced without the seed crystal layer (Subscripts R and S represent $RbLaNb_2O_7$ and $SrTiO_3$, respectively).

It was found that crystallization was promoted, and a (001) oriented thin film having a thickness of about 60 nm was obtained by applying and drying a solution of a metal organic compound capable of creating the composition $RbLaNb_2O_7$ on a glass substrate; and then performing pre-calcination to decompose an organic component in the organic compound of the metal at 400° C.; and then radiating excimer laser having an energy of 60 mJ/cm² at temperature of 400° C. or below (FIG. 3). When a $SrTiO_3$ thin film was formed on the resulting (001) oriented $RbLaNb_2O_7$ thin film similarly using the Excimer Laser Assisted Metal Organic Deposition method, crystal growth was selectively promoted from the surface of the $RbLaNb_2O_7$ thin film, and a (001) oriented $SrTiO_3$ thin film was also successfully obtained (FIG. 4).

Even by the method of growing a Dion-Jacobson phase using Excimer Laser Assisted Metal Organic Deposition (Patent Literature 6), a (001) oriented thin film could not be obtained unless an irradiation energy was optimized for the final thickness. However, when a thin film having a final thickness of 20 to 100 nm was irradiated at a laser fluence in the range between 40 and 100 mJ/cm$^2$, a Dion-Jacobson.RbLaNb$_2$O$_7$ thin film could be obtained which was oriented almost 100% in a (001) direction. For the Excimer Laser Assisted Metal Organic Deposition method, in the case where a seed crystal was present, crystal growth selectively started there, and therefore a perovskite thin film formed in the seed crystal thin film obtained also presumably grew in a (001) orientation. A substrate material may be crystalline or glass. Because all steps can be performed at temperature of 400° C. or below in the present method, processing can be performed on an industrial glass substrate and a Si substrate, a material of which has low thermal tolerance.

Note that the conditions of laser fluence for obtaining a well oriented thin film may need to be adjusted, depending on the conditions of temperature (the temperature of a substrate or atmosphere) upon irradiation, but the conditions of fluence suitable for obtaining a well oriented thin film will be apparent from the description in Examples and Reference Examples below.

EXAMPLES

Specific examples of the present invention are shown and described in detail below. However, the present invention is not limited to these Examples. Substrates used in Example of the present invention were alkaline-free glass substrates and polycrystalline Pt substrates, and a solution of a raw material was a toluene solution of 2-ethylhexanoate of a corresponding metal to be introduced. KrF excimer laser was used for ultraviolet light irradiation.

Example 1

A solution (C1) was prepared by mixing, in a solution of rubidium 2-ethylhexanoate, a solution of lanthanum 2-ethylhexanoate and a solution of niobium 2-ethylhexanoate in a metal ratio of 1:1:2. The C1 solution was spin coated on an alkaline-free glass substrate at 4000 rpm for 10 seconds, which was then pre-calcined at 400° C. for 10 minutes. A temperature of the substrate was then maintained at 400° C., and KrF pulsed laser was radiated at a fluence of 60 mJ/cm$^2$ (50 Hz) for 3 minutes in air atmosphere. For the thin film produced in this manner, a (001) oriented RbLaNb$_2$O$_7$ thin film was grown only at the irradiated area. The Lotgering factor for the (001) orientation was close to 1.

Example 2

In Example 1, when a laser beam was radiated at a fluence of 50 mJ/cm$^2$, a (001) oriented RbLaNb$_2$O$_7$ thin film was grown only at the irradiated area. The Lotgering factor for the (001) orientation was close to 1.

Example 3

In Example 1, when a laser beam was radiated at a fluence of 70 mJ/cm$^2$, a (001) oriented RbLaNb$_2$O$_7$ thin film was grown only at the irradiated area. The Lotgering factor for the (001) orientation was close to 1.

Example 4

In Example 1, when the pre-calcination temperature was set to 300° C., a (001) oriented RbLaNb$_2$O$_7$ thin film was grown only at the laser irradiated area. The Lotgering factor for the (001) orientation was close to 1.

Example 5

In Example 1, when the pre-calcination temperature was set to 600° C., a (001) oriented RbLaNb$_2$O$_7$ thin film was grown only at the laser irradiated area. The Lotgering factor for the (001) orientation was close to 1.

Example 6

In Example 1, when the substrate temperature at the time of laser radiation was set to 500° C., a (001) oriented RbLaNb$_2$O$_7$ thin film was grown only at the laser irradiated area. The Lotgering factor for the (001) orientation was close to 1.

Example 7

In Example 1, when the alkaline-free glass substrate was replaced with a glass substrate on the surface of which polycrystalline Pt was sputtered, a (001) oriented RbLaNb$_2$O$_7$ thin film was grown only at the laser irradiated area.

Example 8

A solution (C2) was prepared by mixing a solution of titanium 2-ethylhexanoate in a solution of strontium 2-ethylhexanoate in a metal ratio of 1:1. The C2 solution was spin coated on the (001) oriented RbLaNb$_2$O$_7$ thin film produced in Example 1 at 4000 rpm for 10 seconds, which was then pre-calcined at 400° C. for 10 minutes. A temperature of the substrate was then maintained at 400° C., and KrF pulsed laser was radiated at a fluence of 75 mJ/cm$^2$ (50 Hz) for 3 minutes in air atmosphere. For the multilayered thin film produced in this manner, a (001) oriented SrTiO$_3$ thin film was grown only at the irradiated area. The Lotgering factor for the (001) orientation was 0.98.

Example 9

To a solution of lanthanum 2-ethylhexanoate, a solution of nickel 2-ethylhexanoate was mixed in a metal ratio of 1:1 to prepare a solution (C3). The C3 solution was spin coated on an alkaline-free glass substrate at 4000 rpm for 10 seconds, which was then pre-calcined at 400° C. for 10 minutes. A temperature of the substrate was then maintained at 400° C., and KrF pulsed laser was radiated at a fluence of 85 mJ/cm$^2$ (50 Hz) for 3 minutes in air atmosphere. For the film produced in this manner, a LaNiO$_3$ thin film which showed an electric resistivity of $4.42 \times 10^{-3}$ Ω·cm was grown only at the irradiated area.

Example 10

The C3 solution was spin coated on the (001) oriented RbLaNb$_2$O$_7$ thin film produced in Example 1 at 4000 rpm for 10 seconds, which was then pre-calcined at 400° C. for 10 minutes. A temperature of the substrate was then maintained at 400° C., and KrF pulsed laser was radiated at a fluence of 50 mJ/cm$^2$ (50 Hz) for 3 minutes in air atmosphere. For the multilayered film produced in this manner, a (001) oriented LaNiO$_3$ thin film which showed an electric resistivity of $1.02 \times 10^{-3}$ Ω·cm was grown only at the irradiated area. The Lotgering factor for the (001) orientation was 0.97.

Example 11

To a solution of sodium 2-ethylhexanoate, a solution of potassium 2-ethylhexanoate and a solution of niobium 2-ethylhexanoate were mixed in a metal ratio of 1:1:2 to prepare a solution (C4). The C4 solution was spin coated on the $LaNiO_3$ thin film produced in Example 9 at 4000 rpm for 10 seconds, which was then pre-calcined at 400° C. for 10 minutes. A temperature of the substrate was then maintained at 400° C., and KrF pulsed laser was radiated at a fluence of 45 mJ/cm² (50 Hz) for 3 minutes in air atmosphere. For the multilayered film produced in this manner, a dielectric $Na_{0.5}K_{0.5}NbO_3$ thin film was grown only at the irradiated area

Example 12

The C4 solution was spin coated on the (001) oriented $LaNiO_3$ thin film produced in Example 10 at 4000 rpm for 10 seconds, which was then pre-calcined at 400° C. for 10 minutes. A temperature of the substrate was then maintained at 400° C., and KrF pulsed laser was radiated at a fluence of 45 mJ/cm² (50 Hz) for 3 minutes in air atmosphere. For the multilayered film produced in this manner, a dielectric (001) oriented $Na_{0.5}K_{0.5}NbO_3$ thin film was grown only at the irradiated area. The Lotgering factor for the (001) orientation was 0.93.

Example 13

To a solution of barium 2-ethylhexanoate, a solution of strontium 2-ethylhexanoate, a solution of calcium 2-ethylhexanoate and a solution of titanium 2-ethylhexanoate were mixed in a metal ratio of 0.693:0.077:0.23:1 to prepare a solution (C5). The C5 solution was spin coated on the (001) oriented $RbLaNb_2O_7$ thin film produced in Example 1 at 4000 rpm for 10 seconds, which was then pre-calcined at 400° C. for 10 minutes. A temperature of the substrate was then maintained at 400° C., and KrF pulsed laser was radiated at a fluence of 75 mJ/cm² (50 Hz) for 3 minutes in air atmosphere. For the multilayered film produced in this manner, a dielectric (001) oriented $(Ba_{0.9}Sr_{0.1})_{0.77}Ca_{0.23}TiO_3$ thin film was grown only at the irradiated area. The Lotgering factor was 0.95.

Example 14

To a solution of calcium 2-ethylhexanoate, a solution of strontium 2-ethylhexanoate, a solution of praseodymium 2-ethylhexanoate and a solution of titanium 2-ethylhexanoate were mixed in a metal ratio of 0.648:0.349:0.002:1 to prepare a solution (C6). The C6 solution was spin coated on the (001) oriented $RbLaNb_2O_7$ thin film produced in Example 1 at 4000 rpm for 10 seconds, which was then pre-calcined at 400° C. for 10 minutes. A temperature of the substrate was then maintained at 400° C., and KrF pulsed laser was radiated at a fluence of 65 mJ/cm² (50 Hz) for 3 minutes in air atmosphere. For the multilayered film produced in this manner, a phosphor (001) oriented $(Ca_{0.65}Sr_{0.35})_{0.997}Pr_{0.02}TiO_3$ thin film was grown only at the irradiated area, showing red fluorescence. The Lotgering factor was 0.98.

Example 15

To a solution of rubidium 2-ethylhexanoate, a solution of calcium 2-ethylhexanoate and a solution of niobium 2-ethylhexanoate were mixed in a metal ratio of 1:2:3 to prepare a solution (C7). The C7 solution was spin coated on a quartz glass substrate at 4000 rpm for 10 seconds, which was then pre-calcined at 400° C. for 10 minutes. A temperature of the substrate was then maintained at 400° C., and KrF pulsed laser was radiated at a fluence of 110 mJ/cm² (50 Hz) for 3 minutes in air atmosphere. For the film produced in this manner, a (100) oriented $RbCa_2Nb_3O_{10}$ thin film was grown only at the irradiated area. The Lotgering factor for the (100) orientation was close to 1.

Example 16

A solution of titanium 2-ethylhexanoate was diluted with toluene to a Ti concentration of 0.2 M to prepare a solution (C8). The C8 solution was spin coated on the (001) oriented $RbLaNb_2O_7$ thin film produced in Example 1 at 4000 rpm for 10 seconds, which was then pre-calcined at 300° C. for 10 minutes. A temperature of the substrate was then maintained at 700° C. for crystallization. The titanium oxide thin film produced in this manner became an anatase type and showed a (001) orientation. The Lotgering factor (a lattice plane of the tetragonal square lattice for the anatase-type titanium oxide is taken as an ab plane) was 0.92. The obtained (001) oriented anatase-type titanium oxide thin film showed an photocatalytic activity, and decomposition of methylene blue was observed under ultraviolet irradiation.

Example 17

Silver 2-ethylhexanoate was dissolved in toluene, pyridine and propionic acid, and a solution of niobium 2-ethylhexanoate, a solution of strontium 2-ethylhexanoate and a solution of titanium 2-ethylhexanoate were mixed in a metal ratio of Ag:Sr:Nb:Ti=0.75:0.25:0.75:0.25 to prepare a solution (C9). The C9 solution was spin coated on the (001) oriented $RbLaNb_2O_7$ thin film produced in Example 1 at 4000 rpm for 10 seconds, which was then pre-calcined at 400° C. for 10 minutes. A temperature of the substrate was then maintained at 900° C. for crystallization. The $Ag_{0.75}Sr_{0.25}Nb_{0.75}Ti_{0.25}O_3$ thin film produced in this manner showed a (001) orientation. The Lotgering factor was 0.96.

Example 18

Tungsten ethoxide was dissolved in ethanol to prepare a solution (C10). The C10 solution was spin coated on the (001) oriented $RbLaNb_2O_7$ thin film produced in Example 1 at 4000 rpm for 10 seconds, which was then pre-calcined at 300° C. for 10 minutes. A temperature of the substrate was then maintained at 500° C. for crystallization. The $Rb_{0.28}WO_3$ thin film produced in this manner showed a (100) orientation.

Reference Example 1

In Example 1, when the substrate temperature was 400° C., laser irradiation at a fluence of 40 mJ/cm² did not promote crystal growth enough to allow a $RbLaNb_2O_7$ thin film to be crystallized at the irradiated area.

Reference Example 2

In Example 1, laser irradiation at a fluence of 110 mJ/cm² slightly allowed a $RbLaNb_2O_7$ thin film to grow at the irradiated area with poor crystallization and a poor degree of the (001) orientation.

Reference Example 3

In Example 9, when the substrate temperature was 400° C., laser irradiation at a fluence of 60 mJ/cm² or 100 mJ/cm² could reduce the electric resistivity of the LaNiO$_3$ thin film generated at the irradiated area merely down to about $1.00 \times 10^{-1}$ Ω·cm.

Reference Example 4

In Example 10, when the substrate temperature was 400° C., laser irradiation at a fluence of 30 mJ/cm$^2$ or 70 mJ/cm$^2$ could reduce the electric resistivity of the LaNiO$_3$ thin film generated at the irradiated area merely down to about $1.00 \times 10^{-1}$ Ω·cm.

Reference Example 5

In Example 11, when the substrate temperature was 400° C., laser irradiation at a fluence of 30 mJ/cm$^2$ or less could not allow the Na$_{0.5}$K$_{0.5}$NbO$_3$ thin film to be effectively crystallized.

Reference Example 6

In Example 12, laser irradiation at a fluence of 80 mJ/cm$^2$ or more could not allow the Na$_{0.5}$K$_{0.5}$NbO$_3$ thin film crystallized at the irradiated area to be (001) oriented.

The perovskite-type oriented layered material manufactured according to the present invention is highly oriented and expected to show high performance. It can be widely used as various electronic materials such as dielectric substances, piezoelectric bodies and phosphors.

The invention claimed is:

1. A method of manufacturing an oriented Dion-Jacobson perovskite-type oxide thin film, the method comprising the steps of: forming a thin film comprising an organic metal salt or an alkoxide salt or an amorphous thin film on a substrate, wherein the thin film or the amorphous thin film can form a perovskite-type oxide called a Dion-Jacobson phase represented by the composition formula A(B M$_{n-1}$O$_{3n+1}$)(wherein n is a natural number of 2 or greater; A represents one or more monovalent cations selected from Na, K, Rb and Cs; B comprises one or more components selected from a trivalent rare earth ion, Bi, a divalent alkaline earth metal ion and a monovalent alkali metal ion; M comprises one or more of Nb and Ta; Ti, Zr may be solid soluted); maintaining temperature between room temperature and 600° C.; allowing a crystal to grow while irradiating the amorphous thin film or the thin film comprising the organic metal salt or the alkoxide salt on the substrate with ultraviolet light, thereby obtaining an oriented structure in a (001) direction which is a layered direction where A site cations are regularly aligned in layers on the substrate.

2. The method of manufacturing a (001) oriented Dion-Jacobson perovskite-type oxide thin film according to claim 1, wherein the amorphous thin film is produced by any of MBE, vacuum deposition, CVD, coating pyrolysis, and wherein an organic compound in the film of the organic metal salt or the alkoxide salt is one species selected from β-diketonato, long chain alkoxide having 6 or more carbon atoms and organic acid salts which may contain halogen.

3. The method of manufacturing a (001) oriented Dion-Jacobson perovskite-type oxide thin film according to claim 1, wherein the ultraviolet light is a pulsed laser of 400 nm or less, and a thin film with a thickness of 300 nm or less after the film-forming crystallization is irradiated with a laser beam having a fluence in the range between 40 and 100 mJ/cm$^2$ per laser irradiation.

4. The method of manufacturing a (001) oriented Dion-Jacobson perovskite-type oxide thin film according to claim 1, wherein after performing at least one of the steps of: irradiating the amorphous thin film or the thin film comprising the organic metal salt or the alkoxide salt with an ultraviolet lamp; and heating the amorphous thin film or the thin film at temperature between 300° C. and 600° C., the amorphous thin film or the thin film is irradiated with ultraviolet laser at temperature between room temperature and 600° C.

5. The method of manufacturing a (001) oriented Dion-Jacobson perovskite-type oxide thin film according to claim 1, wherein after irradiating the amorphous thin film or the thin film comprising the organic metal salt or the alkoxide salt with ultraviolet laser at room temperature under the conditions where a combination of frequency and fluence are used such that ablation will not occur, the amorphous thin film or the thin film is irradiated at different fluences with a laser beam having a fluence in the range between 40 and 100 mJ/cm$^2$.

6. The method according to claim 1, wherein the substrate is selected from the group consisting of an amorphous glass substrate, a glass substrate, a polycrystal substrate, and a single-crystal substrate.

7. The method according to claim 6, further comprising the steps of:
forming an amorphous thin film or a thin film comprising an organic metal salt or an alkoxide salt on the (001) oriented Dion-Jacobson perovskite-type oxide thin film, the amorphous thin film or the thin film comprising the organic metal salt or the alkoxide salt formed on the (001) oriented Dion-Jacobson perovskite-type oxide thin film being capable of forming LaNiO$_3$;
maintaining temperature between room temperature and 600° C.; and
allowing a crystal to grow while irradiating the amorphous thin film or the thin film comprising the organic metal salt or the alkoxide salt and capable of forming LaNiO$_3$ with ultraviolet laser having a fluence of 60 mJ/cm$^2$ or less, thereby allowing growth in a (001) orientation and formation of a (001) oriented LaNiO$_3$ thin film on the (001) oriented Dion-Jacobson perovskite-type oxide thin film.

8. The method according to claim 6, further comprising the steps of:
forming an amorphous thin film or a thin film comprising an organic metal salt or an alkoxide salt on the (001) oriented Dion-Jacobson perovskite-type oxide thin film, the amorphous thin film or the thin film comprising the organic metal salt or the alkoxide salt formed on the (001) oriented Dion-Jacobson perovskite-type oxide thin film being capable of forming Li$_x$Na$_y$K$_z$Nb$_a$Ta$_b$O$_3$ where $0.8 < x+y+z < 1.5$ and $0.9 < a+b < 1.1$;
maintaining temperature between room temperature and 600° C.; and
allowing a crystal to grow while irradiating the amorphous thin film or the thin film comprising the organic metal salt or the alkoxide salt and capable of forming Li$_x$Na$_y$K$_z$Nb$_a$Ta$_b$O$_3$ with ultraviolet laser having a fluence in a range between 30 and 60 mJ/cm$^2$, thereby allowing growth in a (001) orientation and formation of a (001) oriented Li$_x$Na$_y$K$_z$Nb$_a$Ta$_b$O$_3$ thin film on the (001) oriented Dion-Jacobson perovskite-type oxide thin film.

9. The method according to claim 8, wherein the (001) oriented Li$_x$Na$_y$K$_z$Nb$_a$Ta$_b$O$_3$ thin film is doped with at least one of Cu, Zn, Al, and B.

10. The method according to claim 8, wherein the (001) oriented Li$_x$Na$_y$K$_z$Nb$_a$Ta$_b$O$_3$ thin film has an oxygen deficiency.

11. The method according to claim 6, further comprising the steps of:
   forming an amorphous thin film or a thin film comprising an organic metal salt or an alkoxide salt on the (001) oriented Dion-Jacobson perovskite-type oxide thin film, the amorphous thin film or the thin film comprising the organic metal salt or the alkoxide salt formed on the (001) oriented Dion-Jacobson perovskite-type oxide thin film being capable of forming $Ba_xSr_yCa_zTi_aZr_bO_3$ where $0.9<x+y+z<1.1$ and $0.9<a+b<1.1$;
   maintaining temperature between room temperature and 600° C.; and
   allowing a crystal to grow while irradiating the amorphous thin film or the thin film comprising the organic metal salt or the alkoxide salt and capable of forming $Ba_xSr_yCa_zTi_aZr_bO_3$ with ultraviolet laser having a fluence in a range between 50 and 100 mJ/cm$^2$, thereby allowing growth in a (001) orientation and formation of a (001) oriented $Ba_xSr_yCa_zTi_aZr_bO_3$ thin film on the (001) oriented Dion-Jacobson perovskite-type oxide thin film.

12. The method according to claim 11, wherein the (001) oriented $Ba_xSr_yCa_zTi_aZr_bO_3$ thin film has an oxygen deficiency.

13. The method according to claim 7, further comprising the steps of:
   forming an amorphous thin film or a thin film comprising an organic metal salt or an alkoxide salt on the (001) oriented $LaNiO_3$ thin film, the amorphous thin film or the thin film comprising the organic metal salt or the alkoxide salt formed on the (001) oriented $LaNiO_3$ thin film being capable of forming $Ba_xSr_yCa_zTi_aZr_bO_3$ where $0.9<x+y+z<1.1$ and $0.9<a+b<1.1$;
   maintaining temperature between room temperature and 600° C.; and
   allowing a crystal to grow while irradiating the amorphous thin film or the thin film comprising the organic metal salt or the alkoxide salt and capable of forming $Ba_xSr_yCa_zTi_aZr_bO_3$ with ultraviolet laser having a fluence in a range between 50 and 100 mJ/cm$^2$, thereby allowing growth in a (001) orientation and formation of a (001) oriented $Ba_xSr_yCa_zTi_aZr_bO_3$ thin film on the (001) oriented $LaNiO_3$ thin film.

14. The method according to claim 13, wherein the (001) oriented $Ba_xSr_yCa_zTi_aZr_bO_3$ thin film has an oxygen deficiency.

15. The method according to claim 6, further comprising the steps of:
   forming a thin film of a metal oxide or an organic metal salt on the (001) oriented Dion-Jacobson perovskite-type oxide thin film, the thin film of the metal oxide or the organic metal salt formed on the (001) oriented Dion-Jacobson perovskite-type oxide thin film being capable of forming a metal oxide represented by a composition formulae $ABO_3$, $A_2BO_4$, $A_3B_2O_7$ to which at least one element selected from the group consisting of Ce, Pr, Nd, Sm, Eu, Gd, Tb, Dy, Ho, Er, Tm, Yb and Lu is added, wherein A is an alkaline earth metal element selected from Ca, Sr and Ba, and B is a metal element selected from Ti and Sn;
   maintaining temperature between room temperature and 600° C.; and
   allowing a crystal to grow while irradiating the formed thin film of the metal oxide or the organic metal salt with ultraviolet laser, thereby allowing growth in a (001) orientation and formation of a (001) perovskite-type oxide phosphor thin film on the (001) oriented Dion-Jacobson perovskite-type oxide thin film.

16. The method according to claim 1, wherein n=3 and the Dion-Jacobson perovskite-type oxide thin film is represented by the composition formula of $AB_2M_3O_{10}$, and wherein the ultraviolet light is provided by an ultraviolet laser having a fluence of 100 mJ/cm$^2$ or more, thereby allowing orientation in a (100) direction orthogonal to a layered direction where A site cations are regularly aligned in layers on the substrate.

* * * * *